(12) United States Patent
Adler

(10) Patent No.: US 7,165,002 B2
(45) Date of Patent: Jan. 16, 2007

(54) TEST DEVICE FOR DYNAMIC MEMORY MODULES

(75) Inventor: Frank Adler, München (DE)

(73) Assignee: Infineon Technologies AG, Munich (DE)

( * ) Notice: Subject to any disclaimer, the term of this patent is extended or adjusted under 35 U.S.C. 154(b) by 63 days.

(21) Appl. No.: 10/159,849

(22) Filed: May 31, 2002

(65) Prior Publication Data

US 2002/0183955 A1 Dec. 5, 2002

(30) Foreign Application Priority Data

May 31, 2001 (DE) ................. 101 26 591

(51) Int. Cl.
*G01R 31/00* (2006.01)
*G01R 31/14* (2006.01)

(52) U.S. Cl. .................... 702/117
(58) Field of Classification Search ............ 702/117, 702/118, 121–123; 714/29, 42, 718
See application file for complete search history.

(56) References Cited

U.S. PATENT DOCUMENTS

| | | | |
|---|---|---|---|
| 5,865,319 A * | 2/1999 | Okuda et al. ............... 209/574 |
| 6,040,691 A * | 3/2000 | Hanners et al. ............ 324/158.1 |
| 6,351,827 B1 * | 2/2002 | Co et al. ..................... 714/42 |
| 6,622,103 B1 * | 9/2003 | Miller ......................... 702/89 |
| 2002/0056057 A1 * | 5/2002 | Co .............................. 714/42 |
| 2002/0173926 A1 * | 11/2002 | McCord ...................... 702/120 |

FOREIGN PATENT DOCUMENTS

| | | | |
|---|---|---|---|
| DE | 196 25 876 A1 | | 1/1998 |
| KR | 2002014031 | * | 2/2002 |

OTHER PUBLICATIONS

Merriam Webster's Collegiate Dictionary, Tenth Edition, 1997, p. 867.*
Georg Schnurer: "Setup-Guide, Wegweiser durchs Motherboard-BIOS, Teil 1" [setup-guide, guide through the motherboard BIOS, part 1], c't, 1997, No. 3, pp. 344-353.
Hans-Peter Messmer: "PC-Hardwarebuch" [PC hardware book], Addison-Wesley-Longman, Bonn, 5th ed., 1998, pp. 480-481.
Andreas Stiller: "DIMM-Tester, Optimum SD-DIMM Tester von Madex" [DIMM tester, optimum SD-DIMM tester by Madex], c't, 1999, No. 21, p. 112.

* cited by examiner

*Primary Examiner*—Michael Nghiem
(74) *Attorney, Agent, or Firm*—Laurence A. Greenbe; Werner H. Stemer; Ralph E. Locher

(57) ABSTRACT

A test device for dynamic memory modules is described and has an electronic test unit for generating test signals. Accordingly, the electronic test unit has at least one electronic component for generating the test signals, and is configured for use on a personal computer mother board and contains at least one memory controller.

11 Claims, 2 Drawing Sheets

TEST DEVICE FOR DYNAMIC MEMORY MODULES

BACKGROUND OF THE INVENTION

Field of the Invention

The present invention relates to a test device for dynamic memory modules having an electronic test unit for generating test signals for the memory modules.

Special test systems are generally used for testing dynamic memory modules such as dual inline memory modules (DIMMs) or Rambus inline memory modules (RIMMs). Such test systems are cost-intensive and their capacity must therefore be utilized optimally in production. This is usually done by a plurality of memory modules being tested in parallel by a test system. The system Advantest T5581 from the company Advantest or the system Sigma-3 from the company Darkhorse shall be mentioned here as examples of the test systems. While the system T5581 enables a high degree of parallelism and thus a high test throughput, the less expensive system Sigma-3 achieves only about 1/16 of the test throughput of the T5581 for less than a tenth of the procurement costs for a T5581 system.

For testing, a test system feeds test signals to a memory module. More precisely, the test signals are passed to one or more test receptacles into which the memory modules are inserted for testing. The handling of the memory modules, that is to say the feeding of memory modules, the insertion of the fed memory modules into the test receptacles, the withdrawal from the test receptacles and the taking-away of tested memory modules is generally effected by an automatic handler system.

What is disadvantageous about the special test systems, however, is that the tests are not affected in proximity to the application, or are so affected only to a limited extent. In concrete terms, this results in that although the test systems test a memory module completely for defective memory cells or logic failures by special test programs, they map the daily use in a computer system only insufficiently or not at all. Although the performance limits of memory modules are ascertained by performance tests and the voltage dependence of memory modules is also measured, this is an insufficient replacement for a test in proximity to the application.

Further disadvantages that can be stated for the test systems mentioned are the high price thereof and the complicated handling. A T5581 system costs about 4 million euros, and a Sigma-3 system about 300,000 euros. It is often the case, moreover, that the test systems must be programmed and maintained by personnel who are specially trained, which additionally increases the test costs.

SUMMARY OF THE INVENTION

It is accordingly an object of the invention to provide a test device for dynamic memory modules which overcomes the above-mentioned disadvantages of the prior art devices of this general type, which enables the memory modules to be tested in proximity to the application and is cost-effective in comparison with the test systems mentioned in the introduction.

With the foregoing and other objects in view there is provided, in accordance with the invention, a test device for testing dynamic memory modules. The test set contains a personal computer mother board, and a chip set connected in the personal computer mother board. The chip set contains at least one electronic component generating test signals for testing the dynamic memory modules and at least one memory controller. Test receptacles are connected to the chip set and have electrical terminals. The test signals are supplied to the electrical terminals of the test receptacles for testing the dynamic memory modules. A handler system is provided for automatically feeding the dynamic memory modules to be tested, for inserting the dynamic memory modules into the test receptacles, for withdrawing the dynamic memory modules from the test receptacles, and for taking away tested memory modules.

The invention is based on the idea that at least one electronic component which is configured for use on main circuit boards (i.e. mother boards) of personal computers and contains at least one memory controller can advantageously be used for a memory module test in proximity to the application. This is because the at least one memory controller drives the memory on the main circuit board in a typical application. For this purpose, it regulates the temporal sequences of drive signals of the memory (so-called timings) such as sequences of commands and evaluation of data. The idea is based primarily on the insight that many memory modules are used in personal computers anyway, more precisely are inserted on the main circuit boards thereof, and are in this case driven by the electronic components provided on the main circuit boards, so that a test with such electronic components optimally maps the later application of the memory modules.

A particular advantage is that the electronic components are mass-produced products and are therefore offered at correspondingly inexpensive prices. Generally, they are also widely distributed and easily obtainable. In the meantime, on account of the constant advances in integration, the electronic components have become very small, i.e. require a very small space on the main circuit board of a personal computer, and can thus be incorporated for example directly into a receptacle or performance board for a handler system in the case of the test device according to the invention. As a result, they also do not require complicated cooling equipment, which is generally required in the case of the test systems mentioned in the introduction. A test device configured according to the invention is thus very cost-effective in comparison with a conventional test system.

The electronic components furthermore enable a variation of the clock frequency of test signals for the memory modules to be tested, as a result of which the performance limits of the memory modules can be tested (so-called margin in the memory test; this is understood as the overclocking of a dynamic memory in order to find out the functionality thereof at different clock frequencies). Finally, it shall also be mentioned that such a test device can also be extended for a high degree of parallelism. For this purpose, a plurality of electronic components are driven synchronously and in parallel, so that all the dynamic memory modules to be tested are tested in parallel with the same test program.

A preferred embodiment of the test device for dynamic memory modules contains a handler system for the automatic feeding of memory modules to be tested, insertion thereof into test receptacles and for taking away tested memory modules, and also an electronic test unit for generating test signals which are passed to electrical terminals of the test receptacles for testing memory modules. The electronic test unit has the at least one electronic component for generating the test signals which is provided for use on a main circuit board for a personal computer and contains at least one memory controller.

The at least one electronic component is preferably part of a chip set which is provided on the main circuit board, in particular for driving dynamic memory modules. The chip set is preferably configured for an IBM-compatible personal computer; the at least one electronic component is then preferably part of a north bridge component of the chip set. In concrete terms, in a preferred embodiment of the test device, electronic components are used which are generally built on IBM-compatible main circuit boards. The term north bridge was produced by the company Intel and denotes a first main component of a chip set for an IBM-compatible main circuit board (south bridge is the designation for the second main component of the chip set) which generally connects the central processing unit (CPU) to the main memory, that is to say the dynamic memory modules on the main circuit board, the advanced graphics port (AGP) spot for a graphics card and the south bridge component. The connection is effected via the system bus, the so-called front side bus.

Preferably, provision is made of a programmable frequency generator for providing a basic clock frequency for the at least one electronic component. This enables a reprogramming of the frequency for testing the dynamic memory modules. A change in frequency may serve for "overclocking" the dynamic memory modules, as a result of which the specifications of the dynamic memory modules can be tested in a wide clock frequency range of the memory modules.

In a preferred embodiment of the test device provision is made of at least one system processor for executing at least one test program for memory modules, and of at least one main memory for storing the test program and test results. For a particularly high performance, the system processor may have a cache memory. The main memory is preferably a static random access memory (RAM).

In order to be able to link computers to the test device, the latter may have at least one interface for linking a computer. The computer is preferably configured for loading the at least one test program into the at least one main memory, for evaluating the test results and/or controlling the handler system via the interface.

In a currently preferred development, the electronic test unit of the test device contains at least one main circuit board of a personal computer. In this case, each main circuit board has the at least one electronic component for generating the test signals. Furthermore, the main circuit board is provided for testing a predetermined number of dynamic memory modules.

The main circuit board may furthermore have a network terminal and be connected via the latter to a computer for controlling, in particular starting up and shutting down, the test device. The computer, for example as an external computer, that is to say one not integrally belonging to the test device, may be a typical workstation on which a program for controlling the test device is executed.

All the main circuit boards are preferably of the same type, for example from one manufacturer. This facilitates maintenance, since only one type of main circuit board has to be supported. Furthermore, this ensures within a certain framework that the current consumption, the functionality, the evolution of heat during operation, etc. essentially match. All the main circuit boards can be supplied with an external clock signal by a central frequency generator. This ensures that all the tests proceed essentially synchronously. In order to realize the same voltage supply for all the memory modules that are to be tested in parallel, all the main circuit boards are preferably supplied by a common voltage source.

In a particularly preferred embodiment, at least one memory receptacle on the at least one main circuit board is connected to a test receptacle by an adapter. A suitable adapter for this purpose preferably contains a plug for a memory receptacle on a main circuit board, a ribbon cable for signal conduction and a plug for coupling to a test receptacle.

The test receptacles are preferably mounted on a performance board that is configured for the handler system. As a result of this, it is possible for example to continue to use a handler system already present in a test regime. It is thus not necessary, in principle, to procure a new handler system for the test device according to the invention.

The dynamic memory modules are preferably DIM and/or RIM modules. Such memory modules have in the meantime become the standard in particular in the area of IBM-compatible personal computers.

Other features which are considered as characteristic for the invention are set forth in the appended claims.

Although the invention is illustrated and described herein as embodied in a test device for dynamic memory modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
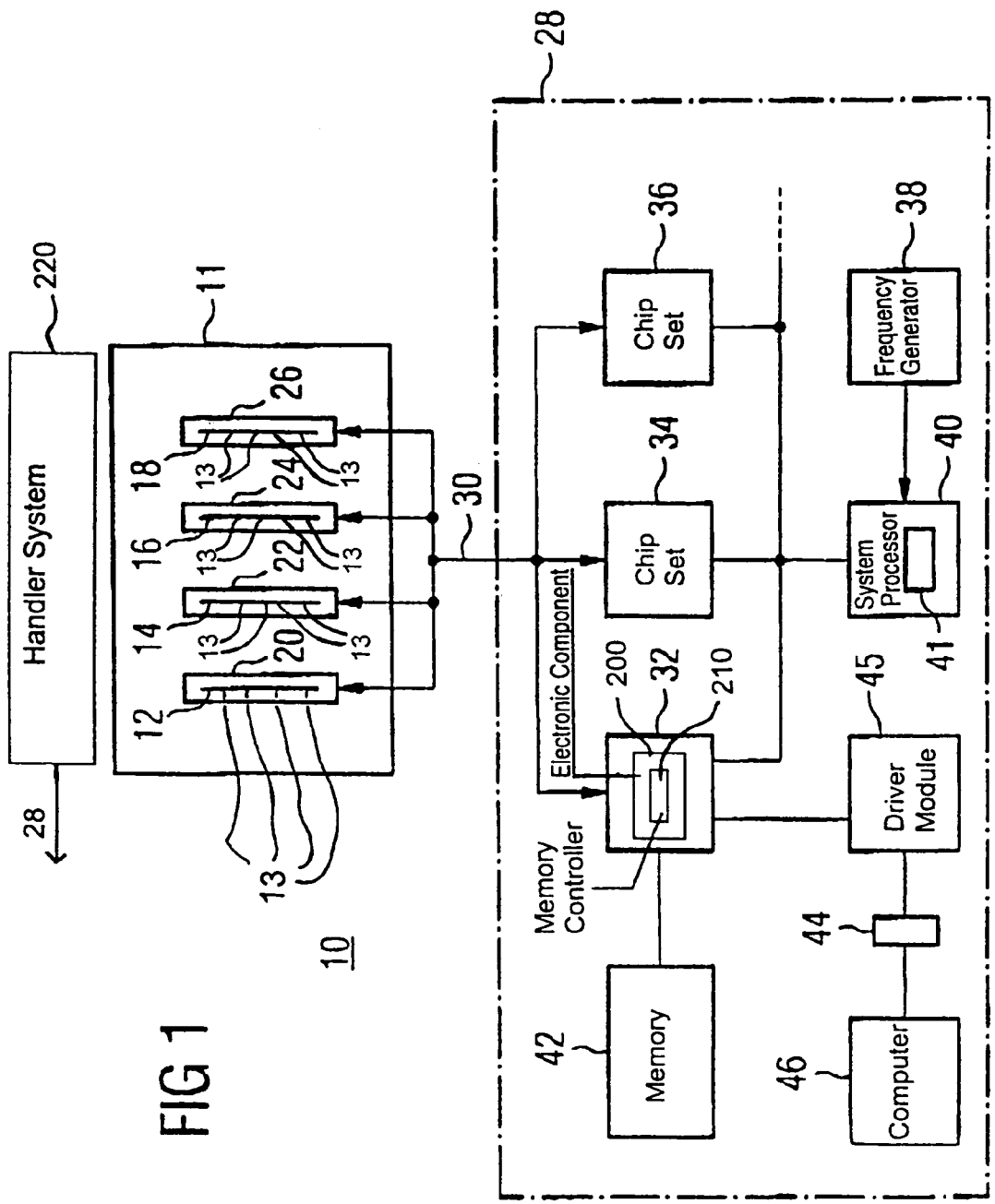
FIG. 1 is a block diagram of a first exemplary embodiment of a test device with an electronic test unit which has electronic components of a north bridge chip set for a main circuit board of a personal computer according to the invention.

In all the figures of the drawing, sub-features and integral parts that correspond to one another bear the same reference symbol in each case. Referring now to the figures of the drawing in detail and first, particularly, to FIG. 1 thereof, there is shown a test device 10 that has four test receptacles 20, 22, 24 and 26 on a performance board 11 for receiving dynamic memory modules 12, 14, 16, 18, respectively, to be tested. The test receptacles 20, 22, 24, 26 each have electrical terminals 13 for connecting to the terminals of the memory modules 12, 14, 16, 18. The memory modules 12, 14, 16, 18 are either dual inline memory (DIM) or Rambus inline memory (RIM) modules. Furthermore, an electronic test unit 28 is provided, which generates test signals 30 for the test receptacles 20, 22, 24 and 26. The test signals 30 serve for testing the dynamic memory modules 12, 14, 16 and 18 and are therefore passed to contact pins in the test receptacles 20, 22, 24, 26.

The electronic test unit 28 contains a plurality of identical chip sets 32, 34 and 36, only three of which are illustrated. The broken line indicates that the electronic test unit 28 can be extended as desired by further chip sets and can thus be extended for a virtually arbitrary number of memory modules to be tested. Each of the chip sets 32, 34 and 36 is provided for testing a predetermined number of memory modules and contains at least one electronic component 200 that in turn has at least one memory controller 210. In this case, the electronic component 200 is part of a north bridge component of the respective chip set. What is achieved by the use of such chip sets for generating memory test signals is testing in proximity to the application, in particular by the memory controller of each chip set.

The first chip set 32 functions as a master, while all of the further chip sets 34 and 36 are connected as slaves. Master defines that the first chip set 32 controls the test sequence and for this purpose is connected to a static memory as a main memory 42 and to a driver module 45 for interfaces and a test program upload (serial, parallel and/or by USB). The driver module 45 in turn communicates with an interface 44, to which a computer 46, for example a workstation, is connected. Via the computer 46, it is possible to control the test device 10, in particular a handler system 220 (only symbolically shown) for the feeding of memory modules 12, 14, 16, 18 that are to be tested to the test receptacles, for insertion into the latter and withdrawal again after tests have been concluded, and for taking away the tested memory modules.

In order to control the test sequence, a system processor 40, for example a conventional processor for personal computers, such as a Pentium 4 processor from the company Intel, is provided in the electronic test unit 28. The system processor 40 has a cache memory 41 for increasing the performance of an access to the main memory 42. Finally, provision is made of a programmable frequency generator 38 for clocking the system processor 40 and prescribing the clock frequency for the tests.

For operation of the test device 10, the computer 46 loads one or more test programs into the main memory 42 via the interface 44 and the driver module 45. Once loading has been affected, a main program can be started via the computer 46, which main program is executed by the system processor 40. The main program can control the handler system 220. Various subroutines are then provided for the actual tests of the dynamic memory modules. The entire electronic test unit 28 can be accommodated in the performance board 11, which is adapted to the handler system 220 for the memory modules. In order to be able to create specifications for the memory modules to be tested, it is possible to alter the clock frequencies for operating the memory modules, which are essentially determined by the system processor 40 and the chip sets 32, 34 and 36. This can be affected by reprogramming the programmable frequency generator 38.

Figure 2:
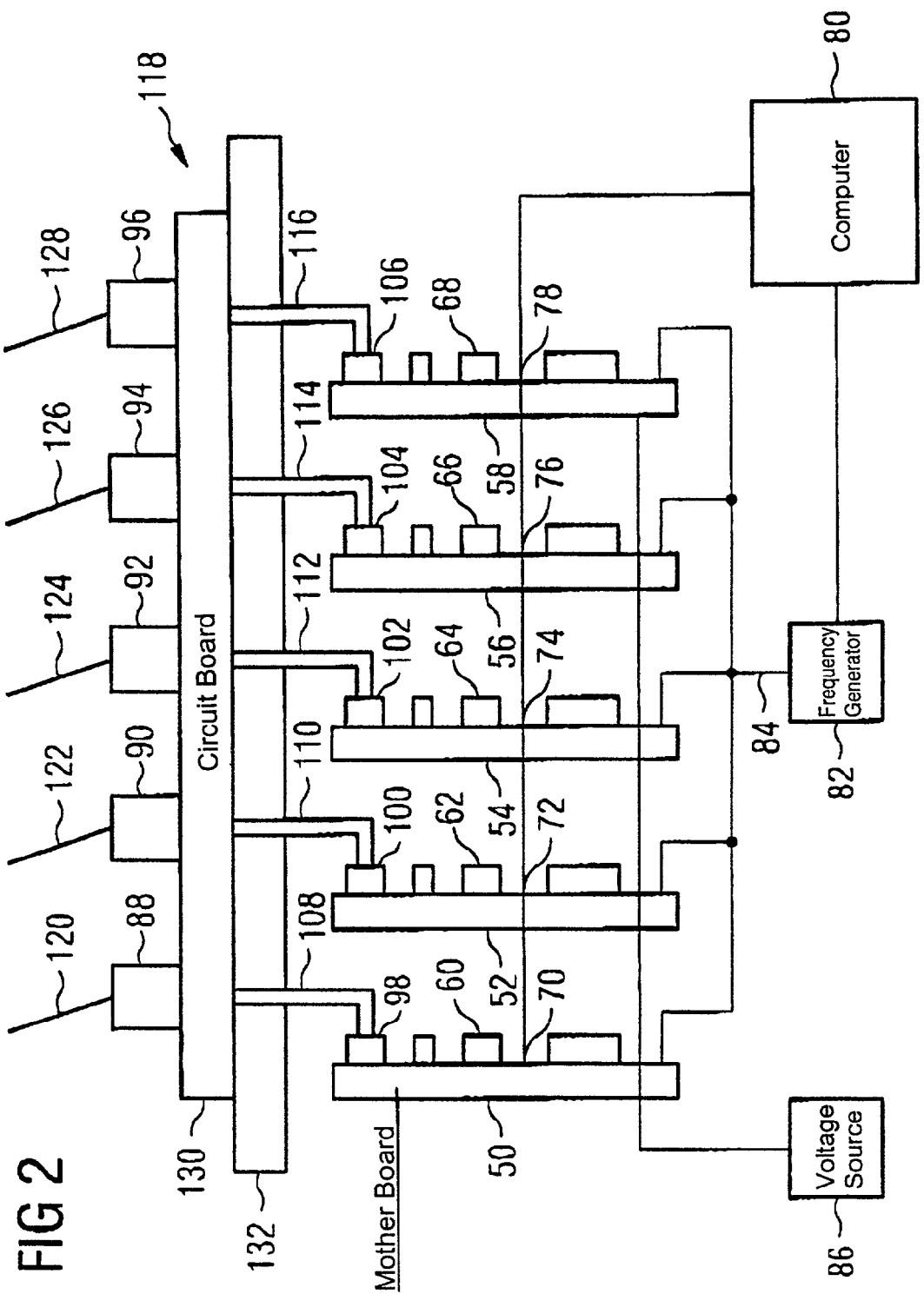
FIG. 2 is a block diagram of a second exemplary embodiment of the test device according to the invention with five main circuit boards of a personal computer.

FIG. 2 shows a further test device with a performance board 118 for the handler system. The performance board 118 contains a carrier plate 132 and a circuit board 130, on which test receptacles 88, 90, 92, 94 and 96 are mounted and electrically wired. The test receptacles 88, 90, 92, 94 and 96 serve for receiving dynamic memory modules 120, 122, 124, 126 and 128 to be tested.

Each test receptacle 88, 90, 92, 94 and 96 is respectively driven by a main circuit board 50, 52, 54, 56 and 58. The main circuit boards are all of the same type and are normally provided for a personal computer. In the sense of the invention, they are now used for memory module testing in proximity to the application. The main circuit boards 50, 52, 54, 56 and 58 have a chip set 60, 62, 64, 66 and 68, which contain at least one electronic component with at least one memory controller. The signals of the memory controller of each electronic component of each chip set 60, 62, 64, 66 and 68 are fed to a memory receptacle 98, 100, 102, 104 and 106 on each main circuit board 50, 52, 54, 56 and 58, respectively.

The signals are fed from the memory receptacles 98, 100, 102, 104 and 106 via a respective adapter 108, 110, 112, 114 and 116 to the respective test receptacle 88, 90, 92, 94 and 96 of the performance board 118.

The main circuit boards 50, 52, 54, 56 and 58 respectively have a network terminal 70, 72, 74, 76 and 78, which may be an Ethernet terminal, for example. Via the network terminal, each main circuit board is connected to a computer 80 for controlling the entire electronic test unit of the test device. The computer 80, for example a workstation, also controls a central frequency generator 82 that provides an external clock signal for the main circuit boards 50, 52, 54, 56 and 58. This ensures synchronous operation of the main circuit boards and thus a synchronous test sequence. A voltage source 86, generally a switched-mode power supply with sufficient power, supplies all the main circuit boards with electrical energy.

The operation hardly differs from the test device illustrated in FIG. 1, so that, for an explanation, reference shall be made to the corresponding part of the description of FIG. 1.

I claim:

1. A test device for testing dynamic memory modules, comprising:
   a personal computer mother board, said personal computer mother board being one of a plurality of identical mother boards;
   a central frequency generator connected to said plurality of identical mother boards, said central frequency generator outputting an external clock signal received by said mother boards;
   a chip set connected in said personal computer mother board, said chip set containing at least one electronic component generating test signals for testing the dynamic memory modules and having at least one memory controller;
   test receptacles connected to said chip set and having electrical terminals, the test signals supplied to said electrical terminals of said test receptacles for testing the dynamic memory modules; and
   a handler system for automatically feeding the dynamic memory modules to be tested, for inserting the dynamic memory modules into said test receptacles, for withdrawing the dynamic memory modules from said test receptacles and for taking away tested memory modules.

2. The test device according to claim 1, wherein said chip set is configured for an IBM-compatible personal computer and said electronic component is part of a north bridge component of said chip set.

3. The test device according to claim 1, further comprising:
   at least one system processor for executing at least one test program for testing the dynamic memory modules, said system processor connected to said chip set; and
   at least one main memory for storing the test program and test results, said main memory connected to said chip set and coupled to said system processor.

4. The test device according to claim 3, further comprising:
   a computer coupled to and loading the test program into said main memory, said computer evaluating the teat results and controlling said handler system; and at least one interface for coupling said computer to said chip set.

5. A test device for testing dynamic memory modules, comprising:
- at least one personal computer mother board having at least one electronic component generating test signals for testing a predetermined number of the dynamic memory modules, said at least one personal computer mother board being one of a plurality of identical mother boards; and
- a central frequency generator connected to said plurality of identical mother boards, said central frequency generator outputting an external clock signal received by said mother boards.

6. The test device according to claim 5, further comprising a computer for controlling the test device, and said at least one personal computer mother board having a network terminal connected to said computer.

7. The test device according to claim 5, further comprising a common voltage source connected to and supplying all of said mother boards.

8. The test device according to claim 5,
further comprising a test receptacle for receiving a dynamic memory module;
further comprising an adapter connected to said test receptacle; and
wherein said at least one personal computer mother board has at least one memory receptacle for communicating with the dynamic memory modules, said memory receptacle connected to said test receptacle through said adapter.

9. The test device according to claim 8, further comprising a performance board configured for a handler system and said test receptacle is mounted on said performance board.

10. The test device according to claim 5, wherein the dynamic memory modules are selected from the group consisting of dual inline memory modules and Rambus inline memory modules.

11. A test device for testing dynamic memory modules, comprising:
- a plurality of identical personal computer motherboards, each motherboard of said plurality including at least one electronic component generating test signals for testing a predetermined number of the dynamic memory modules received in a predetermined number of receptacles located on the motherboard; and
- a central frequency generator connected to said plurality of identical mother boards, said central frequency generator outputting an external clock signal received by said mother boards.

* * * * *